(12) United States Patent
Regev

(10) Patent No.: US 6,433,531 B1
(45) Date of Patent: Aug. 13, 2002

(54) METHOD FOR INSTANTANEOUS FREQUENCY MEASUREMENT

(76) Inventor: Zvi Regev, 2427 Highlander Rd., West Hills, CA (US) 91307

( * ) Notice: Subject to any disclaimer, the term of this patent is extended or adjusted under 35 U.S.C. 154(b) by 0 days.

(21) Appl. No.: 08/506,182

(22) Filed: Jul. 25, 1995

(51) Int. Cl.[7] ............................................. G01R 27/26
(52) U.S. Cl. ................................................. 324/77.11
(58) Field of Search ........................... 324/76.11, 76.55, 324/76.79; 455/67.1

(56) References Cited

U.S. PATENT DOCUMENTS

| | | | | |
|---|---|---|---|---|
| 3,939,411 A | * | 2/1976 | James .................... 324/76.35 |
| 3,996,515 A | * | 12/1976 | Baltzer .................... 324/76.79 |
| 4,179,586 A | * | 12/1979 | Mathews .................. 324/76.55 |
| 4,217,580 A | * | 8/1980 | Lowenschuss ............... 343/13 |
| 4,336,541 A | * | 6/1982 | Tsui et al. .................... 342/13 |
| 4,612,545 A | * | 9/1986 | Assendorf et al. ............ 342/16 |
| 4,641,368 A | * | 2/1987 | Sullivan, Jr. ................ 455/239 |
| 4,859,934 A | * | 8/1989 | Gale et al. ................ 324/76.56 |
| 5,323,103 A | * | 6/1994 | Choate .................... 324/76.35 |
| 5,424,631 A | * | 6/1995 | Ward ....................... 324/76.19 |
| 5,499,391 A | * | 3/1996 | Tsui ........................ 455/226.2 |
| 6,031,869 A | * | 2/2000 | Priebe et al. ................ 375/224 |

* cited by examiner

Primary Examiner—Safet Metjahic
Assistant Examiner—T. R. Sundaram
(74) Attorney, Agent, or Firm—W. J. Schneider, Jr.

(57) ABSTRACT

This invention discloses a method of instantaneous frequency measurement. The frequency band of interest is divided into a number of virtual sub-bands. Each sub-band is folded into a common baseband by a band folding down converter. Frequency measurement is achieved in a two part process, part 1 determines the center frequency of the virtual sub-band, while part 2 determines the baseband frequency, the frequency within the virtual sub-band. Both components of the RF frequency are then combined to form the frequency measurement. The frequency determinations for both sub-band frequency and baseband frequency are made by digital processing of the baseband phase measurements. The baseband phase is measured by a multi bit phase sampler, an integral part of the invention.

14 Claims, 8 Drawing Sheets where:

$V_{in} = A \cdot \sin(2 \cdot \pi \cdot F_{in} \cdot t)$ $V_{out} = k1 \cdot \cos(2 \cdot \pi \cdot F_{in} + \Delta\varphi) + k2 \cdot \cos(\Delta\varphi)$ and A, k1 and k2 are constants PRIOR ART    Figure 1

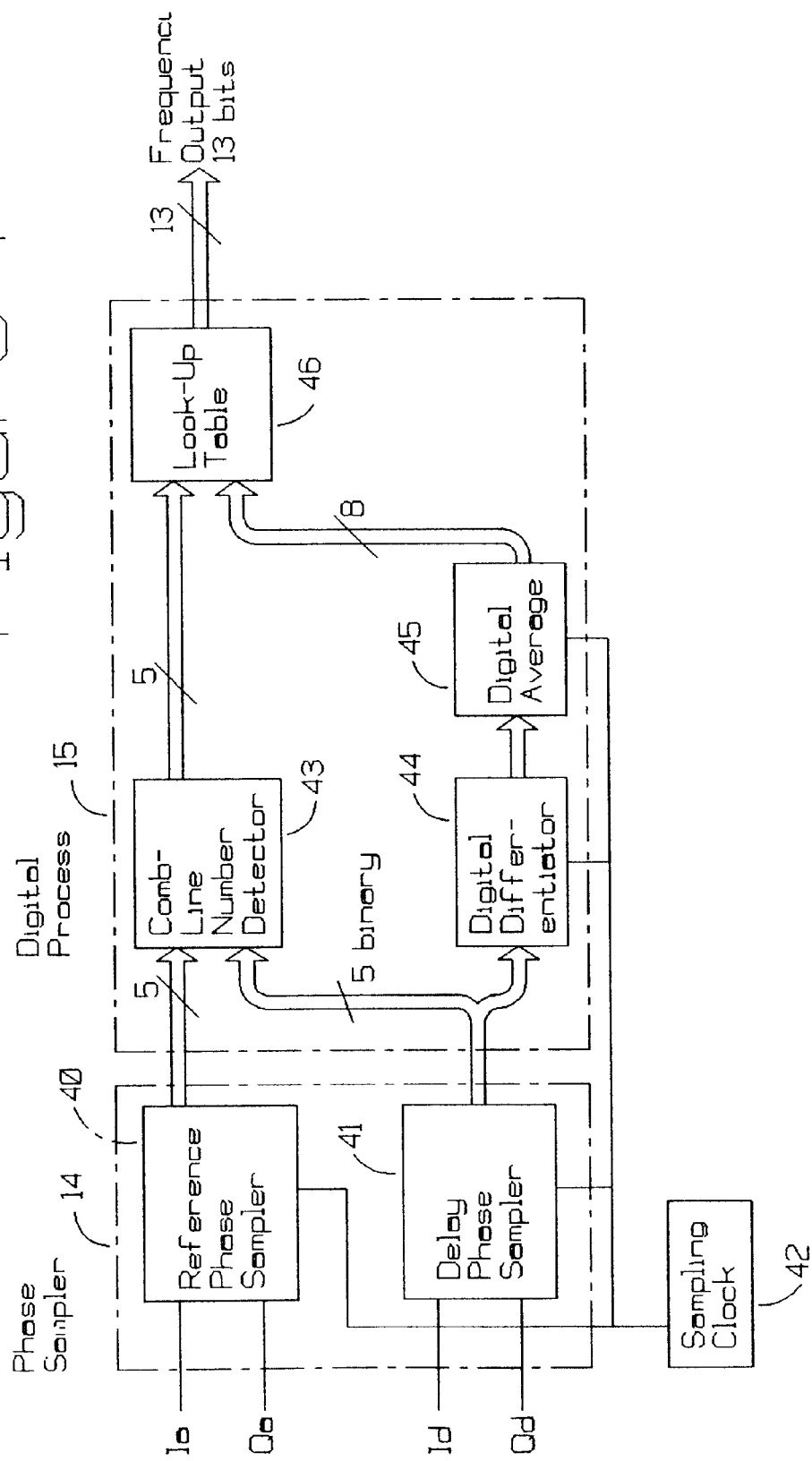

METHOD FOR INSTANTANEOUS FREQUENCY MEASUREMENT

BACKGROUND

Instantaneous Frequency Measurement, IFM, is an integral part of any Electronic Countermeasures System, ECM, that is required to counter a threat whose effectivity is dependent on Pulsed emissions. Most often, these threats take the form of pulsed radars. Since modern radars tend to frequency hop, it is difficult for an ECM system to know, a priori, what is the frequency of the incoming pulse. This knowledge becomes crucial where set-on jammers or non-coherent repeaters must be quickly slewed to the incoming pulse frequency. Even where Digital RF Memories, DRFMs, are utilized, they tend to be narrow band and it is necessary to accurately determine frequency in order to select the correct up conversion frequency. The preferred implementation of the invention is stated for an application requiring IFM over the 2–GHz frequency range with an acquisition time of 100 nanoseconds although the invention is generally applicable to other frequency ranges and acquisition times. The frequency range of 2–6 GHz is a common IF frequency for ECM systems. Typically these systems take the entire microwave spectrum of interest and convert it to 4 GHz spans which are converted to the 2–6 GHz range. 100 nanoseconds is the length of a typical short Radar pulse.

OVERVIEW OF PRIOR ART IFM TECHNIQUES

As a result of the importance of IFM, a number of techniques have been previously developed to help localize the incoming frequency. The description of the prior art which follows enumerates the main approaches to achieving IFM as previously implemented.

Ratio Measurements

In this type of frequency measurement, the carrier frequency is compared to a reference clock frequency to determine the ratio between two frequencies. This is accomplished by counting how many complete cycles of one frequency fit within one complete cycle of the other, all partial cycles discarded. It can be shown that by utilizing this method the frequency measurement resolution is limited to the inverse of the pulse width, or as in the case of 100 nanoseconds, to 10 MHZ. This is due to the fact that only complete cycles are counted. This technique is equivalent to determining the period of the frequency by counting the number of cycles within a given time period. This is the classical method employed by commercial frequency measuring instruments.

Correlators

This type of frequency measurement equipment is based on a correlator or an arrangement of a power splitter, 1, a fixed length delay line, 2, and a mixer, 3 as shown in FIG. 1. The signal RF in is split and then mixed with itself delayed by the delay, $\tau$, causing a phase shift $\Delta\psi$.

Correlator as a frequency discriminator    Eq. 1

$$\text{MixerOutput} = \sin(2 \cdot \pi \cdot Fin) \cdot \sin(2 \cdot \pi \cdot Fin + \Delta\phi)$$

Choose delay $\Delta\phi$ such that $\frac{\pi}{2} \cdot \frac{Fin}{fo} = \Delta\phi$ $$\text{MixerOutput} = \frac{1}{2} \cdot \left[\sin(2 \cdot \pi \cdot Fin) \cdot \sin\left(2 \cdot \pi \cdot Fin + \frac{\pi}{2} \cdot \frac{Fin}{fo}\right)\right] =$$

$$\frac{1}{2} \cdot \cos(\Delta\phi) + \cos(2Fin + \Delta\phi)$$

-continued $$\text{MixerOutput} = \cos\left(\frac{\pi}{2} \cdot \frac{Fin}{fo}\right) = \sin\left(\frac{\pi}{2} \cdot \frac{Fin}{fo} - \frac{\pi}{2}\right) \approx const \cdot \left(\frac{Fin}{fo} - 1\right)$$

The actual signal is obtained by only considering the low frequency component at the output of the mixer, $\cos(\alpha)$. At the frequency for which the delay line equals exactly a quarter wave length, $\alpha=\frac{1}{2}\pi$, the output of the delay lines is in quadrature to the non delayed input and thus the output of the mixer will be zero volts. As the input frequency is moved up or down, the output of the mixer is a DC voltage which can be shown to vary as $\sin(\Delta\psi)$, here $\Delta\psi$ is the phase difference through the delay line. This voltage is digitized and used as a means to indicate the input frequency based on the fact that this system is basically a frequency discriminator. The shorter the delay, the wider the frequency range of unambiguous output. The corollary to this is that the sensitivity is low. Longer delay lines suffer from ambiguity but have greater sensitivity to frequency change. This problem can be avoided by combining the outputs of several of these correlators as shown in FIG. 2. Each correlator, M0 through M4 employs a delay of twice the prior correlator and hence twice the frequency resolution. Shorter delay correlators provide gross frequency resolution and resolve ambiguities of longer delay correlators in a fashion often analogized to a "gas meters". The digitizer, 5, encodes the amplitudes from each correlator when the threshold signal, 6, is received. The digitizer in conjunction with the PROMs 7–9 resolve frequency alignment issues and provides a binary representation of frequency, 10, over a broad range.

The frequency accuracy of a correlator based IFM is ultimately dependent on the transfer properties of the mixers used in the correlators. Variations in DC offset as well as slope due to mixer variations, parameter shift over temperature, and characteristic changes over frequency and input power greatly reduce the accuracy. Typical systems covering an input frequency range of 2–6 GHz can be expected to have no better than 5 MHZ of accuracy assuming that temperature is stabilized and also that the power level of the input signal is constrained to within a 1 dB range.

Acousto-Optic Methods

An example of this category is the Bragg cell which deflects the light generated by a laser into an array of photo diodes. The magnitude of the deflection depends on the input frequency, and thus by detecting which diode of the array is illuminated one can determine the input frequency. The frequency span of such a cell is limited and the frequency resolution depends on the number of photo diodes in the array. But as the number of diodes increases, their size and decreases and the required illumination time increases, which make them impractical. Frequency resolution is a function of the number of discrete photo cells; the beamwidth of the laser beam, and the distance of the photo cells from the Bragg cell. In general, this technology is not practical for resolving the frequency accuracy or resolution to meet the stated requirement.

Dispersive Delay Lines

A common technique for determining the frequency of pulsed signals is the use of surface acoustic wave dispersive delay lines. The frequency of the pulse is determined by the time delay through the dispersive delay line. It is this inherent property that results in this technology not being applicable to modern day requirements. Typical delay times are in the microsecond region such that it would take considerable amount of time to make a frequency detemination. Additionally, SAW devices tend to be narrowband.

Other Methods

Other methods to measure frequency exist but have obvious problems. Examples are filter banks which are bulky and lack resolution; stepped synthesizers which are slow; or bulk dispersive delay lines which suffer the same difficulties as surface dispersive delay lines.

SUMMARY OF THE PRIOR ART

Emerging ECM systems require an IFM which is capable of measuring the carrier frequency of pulsed signals, with a frequency resolution of about 1 MHZ and a small size as the prime concern. At this time, there is no small sized technique for IFM within the stated requirements of an ECM system. The closest technique is that of using binary correlators but this ultimately lacks the required accuracy.

It is an object of this invention to provide a new method of Instantaneous Frequency Measurement which will overcome the deficiencies in the prior art IFMs. The new method is based on extracting the instantaneous phase of a received signal, and obtaining the instantaneous frequency by differentiating the instantaneous phase over time:

Definition of frequency  Eq. 2

Frequency of a signal $E = \sin(\Phi(t))$ is given by: $\frac{1}{2\pi}\frac{d\Phi}{dt}$ It is a further object of this invention to provide a means to measure frequency which much faster than the methods of the prior art provides a higher frequency resolution and accuracy and is independent of device characteristics.

BRIEF DESCRIPTION OF THE DRAWINGS

FIG. 7 Digital Processor

FIG. 10 Code Transformation, Linear to Gray to Binary

DESCRIPTION OF THIS INVENTION

Figure 1:
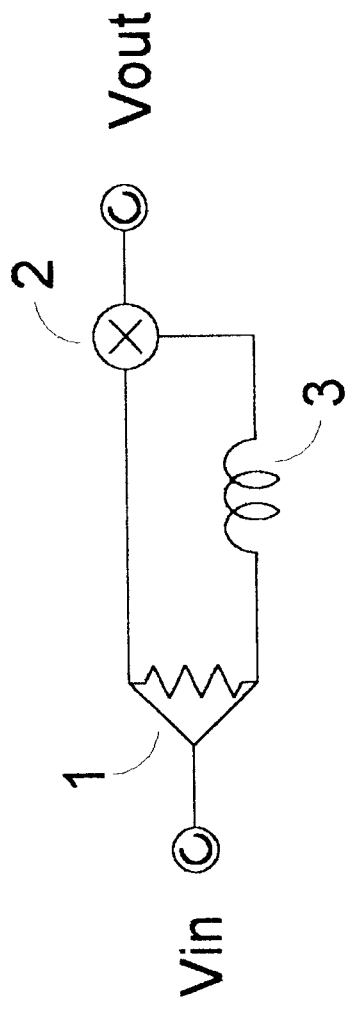
FIG. 1 Correlator/Frequency Discriminator type of IFM
Figure 2:
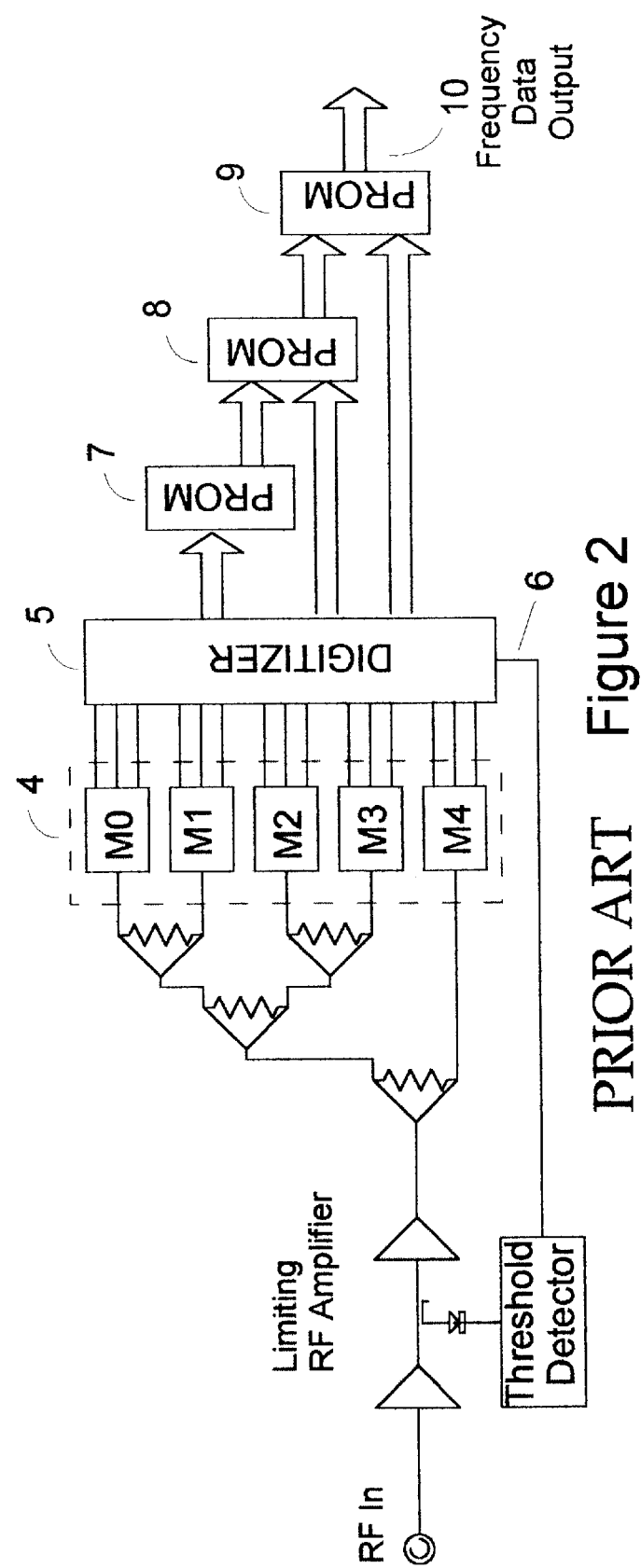
FIG. 2 Extension of Correlator IFM to Multi bit IFM

This invention employs a unique and innovative combination of the following elements and processes:

1) band folding down converter element, an instantaneous process which divides the input band into a plurality of narrower vitual sub-bands, and folds them each into a single baseband for processing;
2) direct phase sampling which directly converts the analog signals in the baseband to digital phase measurements; and
3) a digital processing element which operates on the phase data and extracts the frequency of the baseband signal, Fb, and extracts the virtual sub-band center frequency, Fv.
4) a data combining element which combines the virtual sub-band frequency data and the baseband frequency and the threshold data into a composite frequency data output.

OVERVIEW OF THE INVENTION

This invention utilizes the fact that the baseband signals are band limited so that harmonic frequencies are eliminated leaving only sinusoidal waveforms. These waveforms exhibit a known and predictable relationship between phase and magnitude. This relationship is exploited by the phase sampler which produces, as data, not the instantaneous amplitude as found in prior art IFMs but rather the instantaneous phase.

The invention then uses this phase data to extract the frequency of the baseband signal knowing that the instantaneous frequency equals the change in phase over a change in time, Equation 2 is the definition of frequency. In a sampled system, the derivative can be approximated by using the smallest available increments of t and $\Phi$ in the calculation rather than taking the limit as is appropriate with a continuous function, see Equation 3.

Derivative Form  Eq. 3

Difference Function 3a $$Fi \approx \frac{1}{2\pi}\frac{\Phi_{i+1} - \Phi_i}{t_{i+1} - t_i}$$

Derivative Function 3b $$Fi \approx \frac{1}{2\pi} \cdot \frac{a_{i-k}\cdot\Phi_{i-k} + \ldots + a_i\cdot\Phi_i + \ldots + a_{i+k}\cdot\Phi_{i+k}}{C}$$

where: $Fi$ is the frequency at sample $i$ $\Phi_i$ is the phase at the $i^{th}$ sample There are a number of more sophisticated formulas for differentiation of digital data. In general these approximations in effect fit a continuous curve to the data points and then differential the continuous curve. Several such formulas are found in Hamming's work "Digital Filters". For the purpose of this invention any available differentiation method may be used and any such mains should be considered within the intent of this invention. All that is required is that the phase be differentiated to obtain the instantaneous frequency.

The frequency data is then averaged to produce a more accurate result as indicated in Equation 4 below, the average can also be found using integration, see Equation 9.

Average Frequency  Eq. 4

$$F_{ave} = \frac{1}{s}\sum_{i=1}^{i=s} F_i$$

Band folding

In the preferred embodiment, the input band of 2–6 GHz is folded into fifteen virtual sub-bands, each 266.6 MHZ wide and each folded into a single baseband 133.3 MHZ wide bands by the band folding down converter. The band folding down converter is implemented by mixing the RF input signal with a comb LO consisting of harmonics of the 266.6 MHZ folding clock, Ff. The folding mixer is a quadrature IF Mixer, which provides in-phase and quadrature outputs corresponding to the sidebands around each comb line and converted to 0 to 133 MHz wide base band outputs with similar bands about each multiple of the folding clock. The folded signal appears in both base band outputs. The baseband outputs are in quadrature while the direction of rotation, I leading Q or Q leading I indicates the upper or lower sideband for a band of ±133.3 MHZ.

Phase Sampler Filter and Clock

The phase sampler measures the phase of the baseband at each sample clock Fs. To satisfy Nyquist criteria, the bandwidth of a signal to be sampled must be smaller than one half of the sampling frequency. Applying the criteria to the phase sampler of the preferred embodiment; the baseband signal is limited to less than half of the sampling frequency $F_s$. $F_s$ is 320 MHZ so that the Nyquist bandwidth is 160 MHZ. The input band is folded into basebands of half of the folding clock frequency of 133.3 MHZ. Low pass filters with a cutoff of less than ½ Fs and more than ½ Ff are used to eliminate unwanted frequencies.

Phase Resolver

The quadrature base band signals from each folding mixer can be combined in pairs to generate a Trigonometric Identity  Eq. 5

$$\cos(a+b) = \sin(a)\cdot\cos(b)+\cos(a)\cdot\sin(b)$$

signal of any phase as shown in Equation 5 where the signal phase a is shifted by amount b. Following this method, the I and Q inputs are resolved into a set of signals, each a sinewave at the baseband frequency separated from adjacent signal by $a=360/2^n$. In the preferred embodiment uses a 4 bit phase sampler so than n=4 and the separation is 360°/16= 22.5°. By observing the resolved signals with zero crossing detectors the instantaneous phase of the input signal can then be determined to within 22.5° and a 4 bit phase word generated.

Phase Sampling

The zero crossing detectors are sampled by the sampling clock, Fs, 320 MHZ in the preferred embodiment. The frequency of the baseband signal can be determined by differentiation and averaging as mentioned above. Any of a number of available differentiation algorithms can be used and the results averaged. The preferred embodiment the phase change is averaged over 16 samples, 50 ns at the 320 MHZ rate. The frequency resolution corresponding to one phase increment over the measurement interval is cycles/second is resolution in Hertz: 11.25°/360°/50 nanoseconds =625 kHz, resolution in bits: $\text{Log}_2(.625/266.6) = 8.75$ bits.

Sub Band Determination

An important element of this invention is the technique used to determine the which virtual sub-band is the source the baseband signal. The invention answers the question by employing two folding down converters followed by two phase samplers. Both folding down converters use the same folding clock frequency but these clocks are displaced in phase by $\Delta\psi$. In the preferred embodiment they are displaced by 22.5°.

The input signal is folded by being mixed with a combine LO, a harmonic of the folding clock frequency. The $m^{th}$ harmonic is displaced in phase by the $m^{th}$ multiple of the phase displacement, $\Delta\psi$.

Phase of Delayed Comb  Eq. 6

Phase of $m^{th}$ combline $= 2\pi\cdot m\cdot fc\cdot t + m\cdot\Delta\phi$

The phase of both baseband signals is measured by the phase samplers which follow. ψ Subtracting the phase measurement and dividing by the initial phase displacement, Θ, results in the harmonic number. In the preferred embodiment the first virtual processing band extends from 2000 to 2266.6, the second from 2266.6 to 2533.3. The corresponding harmonic numbers are 7 and 8. The virtual sideband center frequency, Fv, is obtained by multiplying the folding clock frequency, Fc by the harmonic number, m. The result is the 5 bit course frequency number.

Composite Frequency Data

The virtual sub-band frequency Fv, 5 bits is added to Fb, 8 bits to produce a 13 bit frequency indicator with a resolution of 0.625 MHZ over the entire 2–6 GHz frequency range.

BLOCK DIAGRAM OF THE INVENTION

Figure 3:
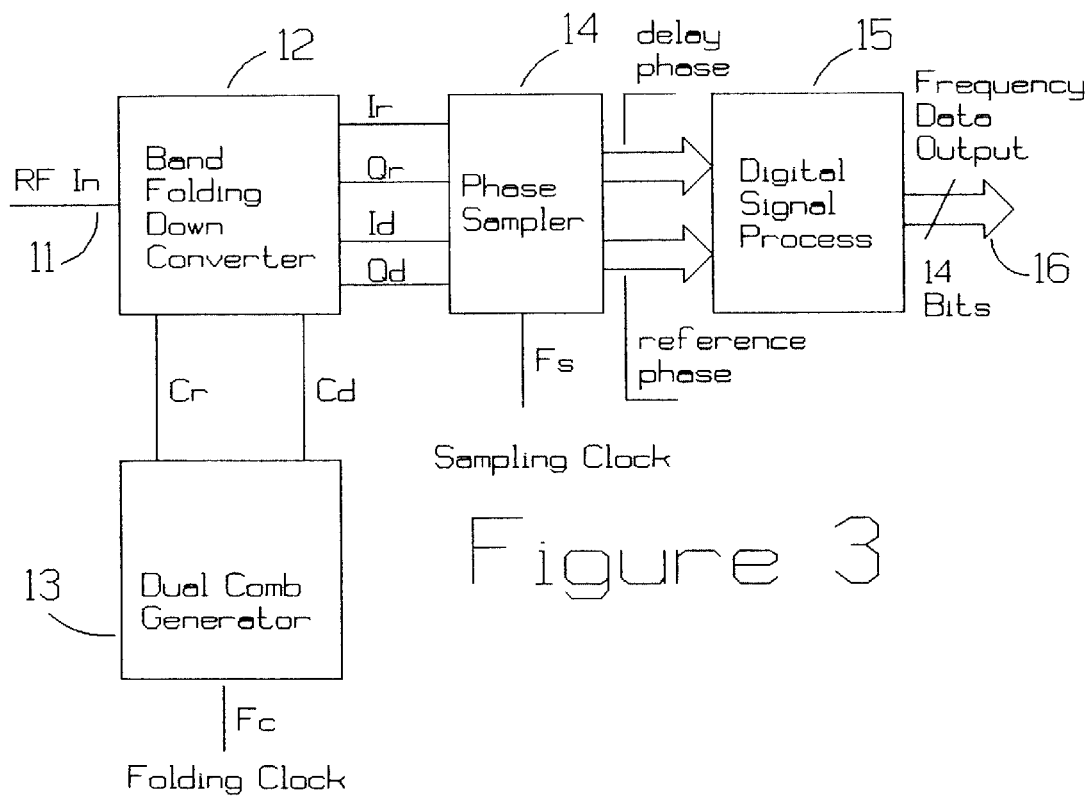
FIG. 3 Phase Sampling IFM, a general block diagram

FIG. 3 is a general block diagram of the invention. The RF input, 11, is presented to band folding down converter, 12, which develops an reference baseband signals, Ir and Qr, delay baseband signals Id and Qd. The converter is driven by the Dual Comb Generator, 13, which provides reference, Cr, and delayed, Cd, versions of the folding clock frequency. These clocks correspond the Ir, Qr, Id and Qd outputs of the Converter. The outputs from the Converter are sampled and encoded as 5 bit binary phase data by Phase Sampler, 14. Digital Processor, 15, determines the virtual sub-band frequency, Fv and the baseband frequency, Fb, and sums them to form the composite frequency output, 16.

DETAILED THEORY OF OPERATION

Developing the I and Q baseband Signals

The success of the invention depends dividing the RF input band into a number of contiguous virtual sub-bands and upon folding the each of the virtual sub-bands into I and Q basebands. The signals in each baseband occupies a bandwidth of ±½ the folding clock frequency and the where the frequency polarity is indicated by the relative phase of the I and Q signals, I leading Q or Q leading I. This is the normal result of mixing an RF band with a comb LO. The common meaning of the term "comb LO" known to those skilled in the RF arts, is an LO which appears simultaneously an a number distinct of frequencies uniformly spaced by a folding clock frequency. The comb LO can be generated from a folding clock signal by modifying the clock waveform into that of an impulse. It should be noted that the comb function is required and the impulse function is its inverse Fourier transform, the sum of all harmonics of a frequency synchronized in phase. The impulse function need not appear explicitly, rather it may generated by the properties of a device such as a step recover diode used as a mixer. The comb must extend at least through the band of frequencies to be folded.

Folding Down Converter

Figure 4:
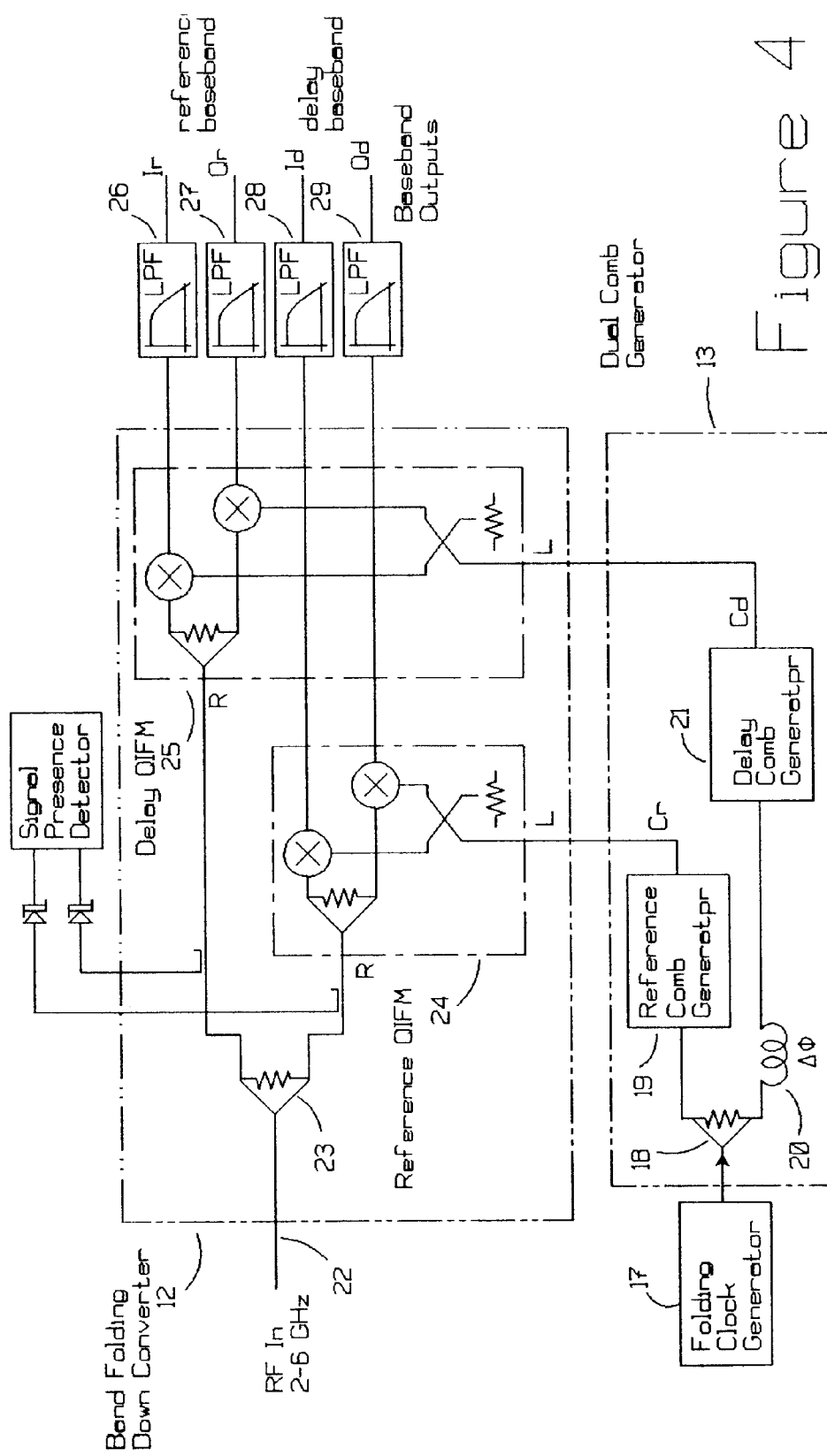
FIG. 4 Band folding Down Converter

FIG. 4 shows the means of developing the baseband signals. The folding Clock Ff is supplied by the folding clock generator, 17, and is split into two paths by power divider, 18. First path goes to the folding clock comb generator, 19. The second path is delayed by delay, 20, before going to delay comb generator 21. Delay 20 provides a phase shift Θ. Θ must of at least 1 LSB of the phase samplers which follow to be recognized by them and less then 360° divided by the highest comb harmonic to be used to avoid ambiguity. Similarly the RF Input, 22, is split into two paths by quadrature power divider 23. The first RF path is connected to the "R" port of folding clock QIFM, 24, while the folding clock comb generator is connected to the "L" port. Similarly the second RF path is connected to the "R" port of delay QIFM, 25, while the delay comb generator is connected to the "L" port.

QIFM

The term QIFM, an acronym for Quadrature Intermediate Frequency Mixer, is well known to those skilled in the RF arts. Two such QIFMs are shown in FIG. 4. These devices are comprised of a power divider, an quadrature power divider and two frequency mixers. The QIFM function can be described in terms of its individual components. The QIFM as a function implies an integrated assembly in which each of the components are matched to the other components. Integration and matching provides generally improved performance over that of a set of functionally similarly but unmatched components.

The outputs of each of the QIFMs passes through low pass filters, LPFs 26–29, which restrict signal frequencies to less than one half if the sampling clock frequency, ½, of the phase sampler which follows but not less than one half of the folding clock frequency, ½ Ff. Additionally they serve to eliminate harmonic content which might otherwise appear as distortion in the waveform.

Each multiple of the folding clock is the center, Fv, of one of the virtual sub-bands. The output from the folding down converter is the phase of the RF input less the phase of the $m^{th}$ multiple of the folding clock. Each sub-band has a width equal the folding clock frequency, Fc, and extends from ½ Ff above to ½ Ff below Fc·m, one-half the folding clock frequency above the $m^{th}$ multiple of the folding clock oscillator to one-half the folding clock oscillator above the $m^{th}$ multiple of the folding clock oscillator. All of the virtual sub-bands are translated to a baseband with a center frequency of 0 and which extend to ±½Ff Determining the Virtual Sub-Band of the RF Input In order to determine the frequency of the RF Input, it is necessary to determine m, the folding clock multiplier for the effective LO of the virtual sub-band. For this step, the invention makes use of the phase samplers which are otherwise used for base band frequency determination. By subtracting the outputs of the reference and delayed phase samplers, the phase difference between the baseband signals generated by the folding clock folding clock and the delayed folding clock is determined.

The only difference between the two sets of baseband signals, Ir, Qr and Id, Qd; is that caused by the phase difference between the folding clocks applied to each folding mixer. This phase difference is multiplied with the folding clock frequency to form each constituent frequency of the comb. The harmonics of the reference and delayed comb generators is given in the Comb Harmonics Table below.

Preferred Implementation Frequency Table below enumerates the virtual sub-bands used in the preferred embodiment, the corresponding harmonic number, the virtual LO frequencies and the phase difference between the baseband output signals.

Comb Harmonics Table

| Harmonics of the Reference Comb | Harmonics of the Delayed Comb |
| --- | --- |
| Sin(2πf · t) | Sin(2πf · t + Δφ) |
| Sin(2 · 2πf · t) | Sin(2 · 2πf · t + 2 · Δφ) |
| Sin(3 · 2πf · t) | Sin(3 · 2πf · t + 3 · Δφ) |
| Sin(4 · 2πf · t) | Sin(4 · 2πf · t + 4 · Δφ) |
| .... | .... |
| Sin(n · 2πf · t) | Sin(n · 2πf · t + n · Δφ) |

Preferred Implementation Frequency Table below enumerates the virtual sub-bands used in the preferred embodiment, the corresponding harmonic number, the virtual LO frequencies and the phase difference between the baseband output signals.

PHASE SAMPLER

Two processes of this invention require phase measurement. First, baseband frequency measurement requires phase differencing or differentiation which require a sequence phase measurements. Second the determinaton of the harmonic number requires subtracting phase measurements. The ability to measure phase is thus essential to this invention. The method of obtaining a digital word representing the phase of the I and Q signals of this invention is considerably faster and simpler than an application of the correlators of the prior art.

Preferred Implementation, Frequency Table

| Input Frequency Band (MHz) | Harmonic Number | Harmonic Frequency (MHz) | Phase Difference (degrees) |
| --- | --- | --- | --- |
| 2000.0 – 2266.6 | 8 | 2133.3 | 180 |
| 2266.6 – 2533.3 | 9 | 2400. | 202.5 |
| 2533.3 – 2800.0 | 10 | 2666.6 | 225 |
| 2800.0 – 3066.6 | 11 | 2933.3 | 247.5 |
| 3066.6 – 3333.3 | 12 | 3200. | 270 |
| 3333.3 – 3600.0 | 13 | 3466.6 | 292.5 |
| 3600.0 – 3866.6 | 14 | 3733.3 | 315 |
| 3866.6 – 4133.3 | 15 | 4000. | 337.5 |
| 4133.3 – 4400.0 | 16 | 4266.6 | 0 |
| 4400.0 – 4666.6 | 17 | 4533.3 | 22.5 |
| 4666.6 – 4933.3 | 18 | 4800. | 45 |
| 4933.3 – 5200.0 | 19 | 5066.6 | 67.5 |
| 5200.0 – 5466.6 | 20 | 5333.3 | 90 |
| 5466.6 – 5733.3 | 21 | 5600. | 112.5 |
| 5733.3 – 6000.0 | 22 | 5866.6 | 135 |

Figure 6:
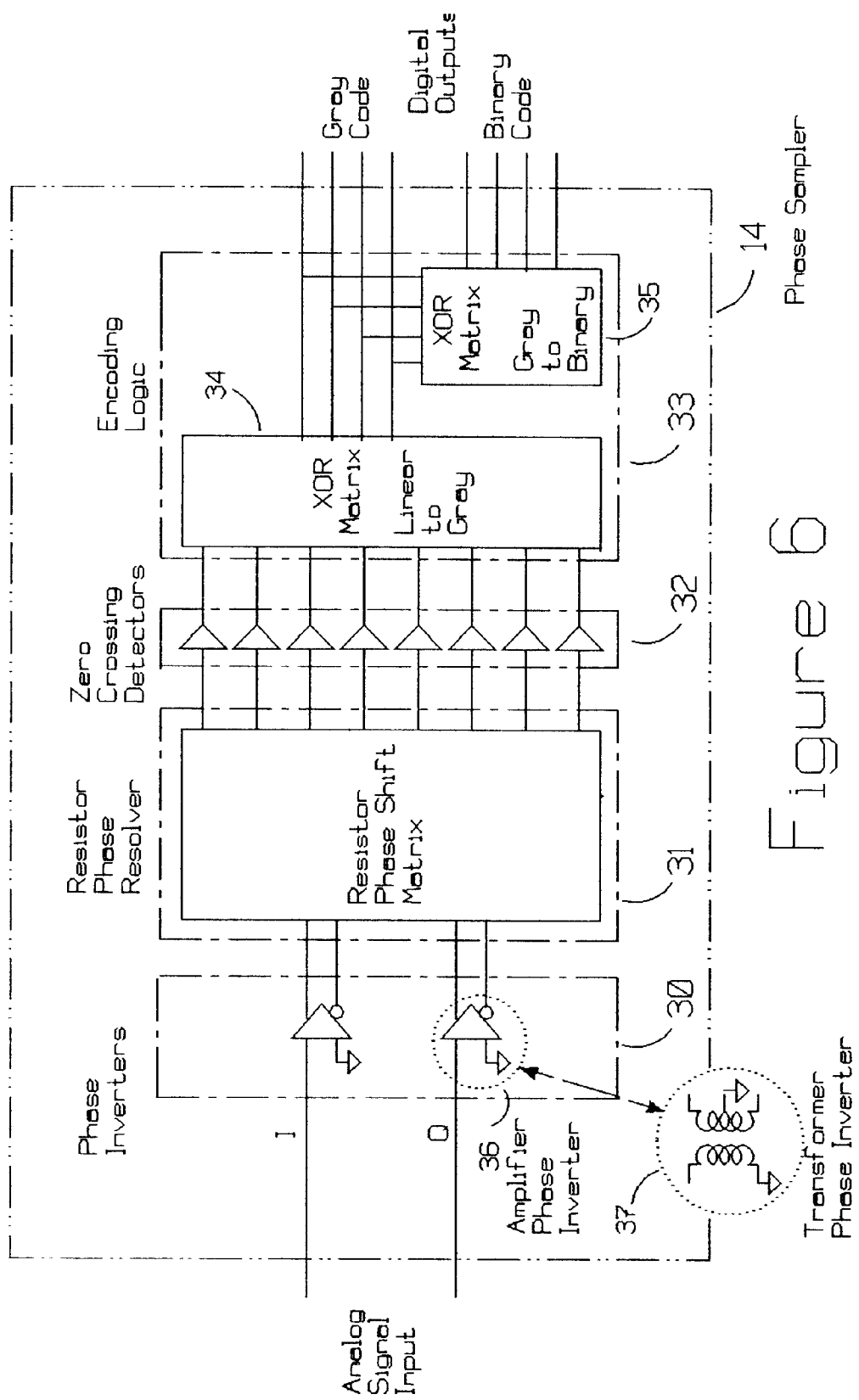
FIG. 6 Phase Sampler
Figure 9:
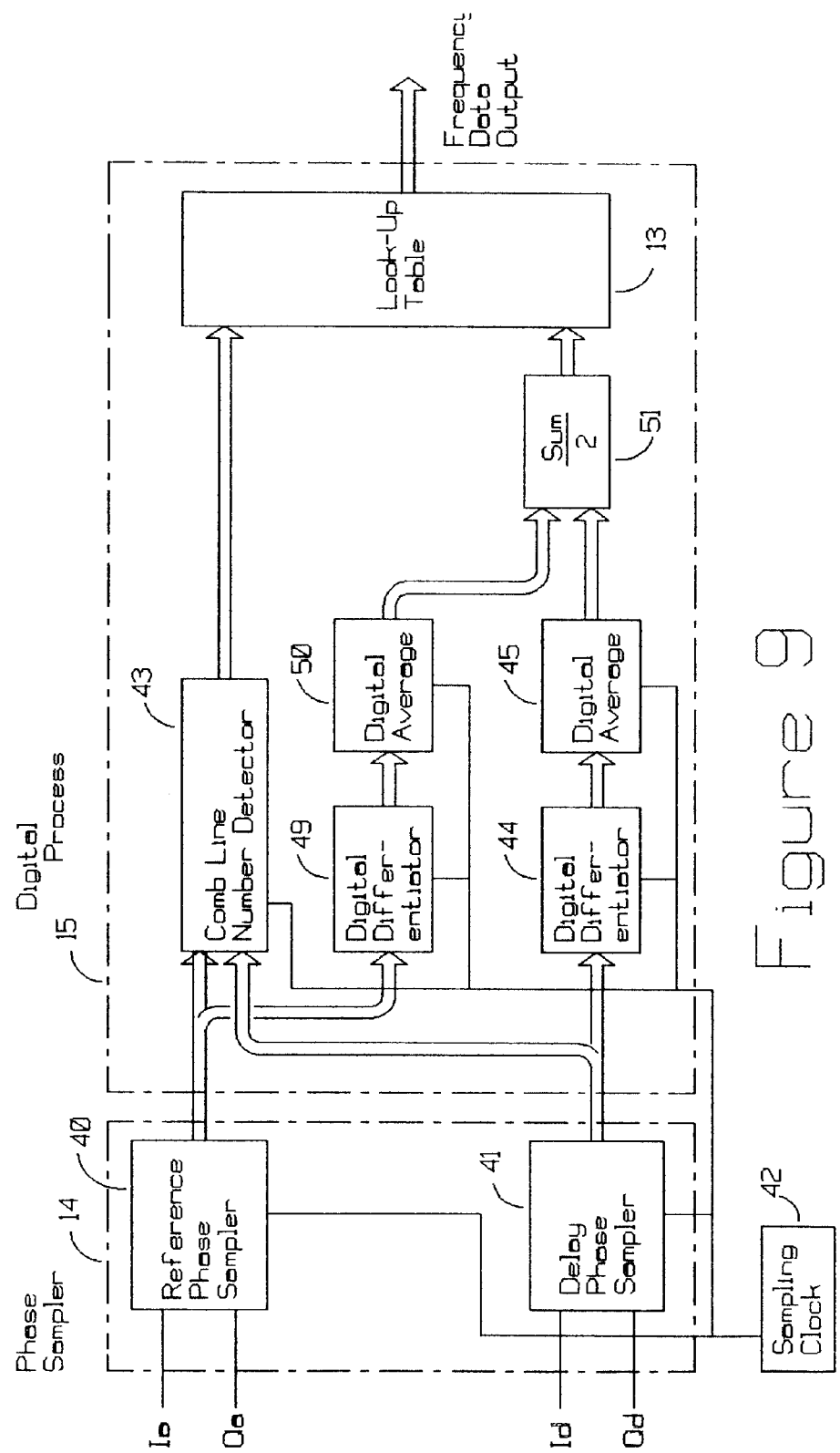
FIG. 9 Digital Processor, IQ Baseband Frequency Measurement

The digital code most often used is the binary code. It is simple and convenient for the arithmetic processes which follow. Other methods of coding for arithmetic are equally valid and choice of another code should be considered within the scope of the invention. The preferred embodiment employs a 4 bit binary code sufficient to describe 15 phase states, separated by 22.5°. The method is comprised of three steps diagramed in FIG. 6, The Phase Sampler. Those steps are phase resolving, zero crossing detection and coding.

PHASE RESOLVER

Obtaining Phase from the I and Q Signals

The I and Q signals obtained from the band folding down converter of FIG. 4 are respectively the sine and cosine of the phase difference between the RF input signal and the $m^{th}$ harmonic of the folding clock, Fc. At a point in time, τ, these signals can be represented as:

$$I(t) = A_i \cdot \sin(2\pi F_b \cdot t + m \cdot \Delta \psi)$$

$$Q(t) = A_q \cdot \cos(2\pi F_b \cdot t + m \cdot \Delta \psi)$$

where: $A_i$ and $A_q$ are the corresponding amplitude constants m is the comb harmonic number Δψ is the delay phase, for the reference band folding down converter is the frequency of the baseband signal, the RF input frequency −m·Fc Prior art Since $A_i$, $A_q$ instantaneous phase of the baseband signal can be determined by dividing the two signals and taking the arctangent of the result. If done according to prior art methods, the voltage level of both I and Q must be converted to digital form by analog to digital conversion, ADC, and then, performing a digital divide:

Trigonometric identity for phase   Eq. 7

$$\frac{I(t)}{Q(t)} = \tan(2 \cdot \pi \cdot F_b \cdot t + \Delta\phi)$$

$$\text{phase} = 2 \cdot \pi \cdot F_b \cdot t + \phi = \text{arctangent}\left(\frac{I(t)}{Q(t)}\right)$$

The phase of the signal can be obtained from a four quadrant arctangent look-up table. This is a slow process in that it requires performing an ADC of two signals, performing a digital divide, and then performing an inverse tangent look-up.

According to this invention the I and Q signals are resolved into a set of $2^n$ composite signals A, B, C, . . . , shifted from the phase of the input $2\pi \cdot Fb \cdot t + m \cdot \Delta\psi$ by a phase of $3600°/2^n$. Each composite signal is constructed as a weighted sum of I and Q displaced from the baseband signal by a multiple of the phase resolution increment $360°/2^n$. The weights are according to Equation 4 above. The phase resolution of an n bit phase resolver evenly divides 360° into $2^n$ increments. Of these only the first $2^n-1$ are required. The resolved signals A, B. . ._j are best understood by reference to FIG. 5b.

Figure 5A:
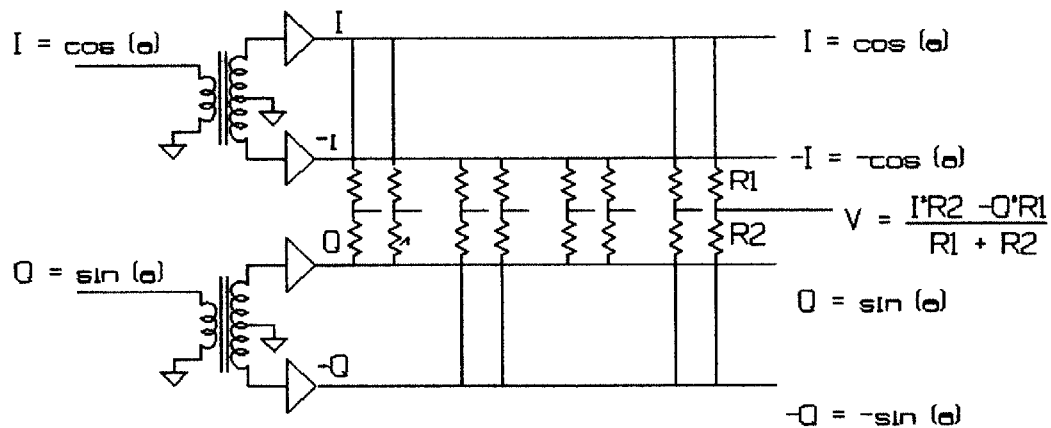
FIG. 5 Phase Resolver Network
Figure 5B:
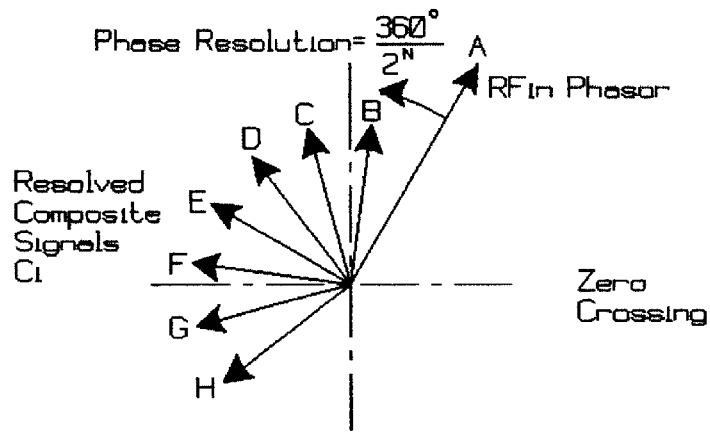
Figure 5C:
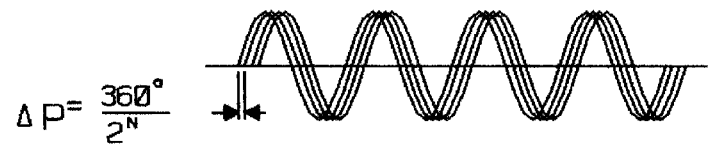

The phase resolver is shown in FIG. 5a. The I and Q inputs are received by phase splitting amplifiers, 31 and 32. Both the I Q signals and their negations, –I or –Q are required in order to achieve negative values of the coefficients. The negative signals may be obtained by any of a number of methods known to those skilled in the art including a high speed operational amplifier or transformers. FIG. 5c shows the resolved waveforms equally spaced in phase shift by an amount $360°/2^n$.

Zero Crossing Detection

Comparators are then provided to monitor the polarity of each of the resolved signals. The polarity reverses when the phase of a resolved signal equals zero. At a point in time corresponding to the sampling clock, the state of all of the comparators is captured. The result is a set of clocked square waves with phase shifts as shown in the waveforms A through H in the LINEAR portion of FIG. 10.

Encoding

The information in these $2^n-1$-waveforms is encoded into n bit binary code representation of the phase of Fb to within a resolution of $360°/2^n$. The coding process involves applying logical operations to waveforms A through H shown in FIG. 10.

The preferred embodiment of this invention codes by transfoming a linear encoded function into a gray coded function and thence to a binary coded function. Both transformations, linear to gray and gray to binary can be lumped into a single block so that transformation appears as linear to binary. Such transformations are well understood by those skilled in the art and this invention is not limited to any specific implementation.

The preferred embodiment uses a 4 bit representation of phase, there are $2^4$ phase steps of $360/2^4=22.5°$. The number of comparator/zero crossing detectors needed is $2^{n-1}=8$ as is shown in FIG. 10. The 8 Linear waveforms are produced by the zero crossing detectors are labeled A through H in FIG. 10. Waveforms J through M correspond to XOR operations as shown. Waveforms in the GRAY block labeled A, E, K, and M are actually 4-bits of gray code developed as shown in FIG. 10. A standard conversion is then made from the gray code to binary. The binary waveforms D0–D3 are shown in FIG. 10.

An important advance offered by phase sampler based method of this invention is its speed. It does not require ADC, arithmetic or look-up table operations. Further increasing the resolution from 4 to 5 bits would not increase the time required for operation. At the same time longer pulses result in a linear increase in frequency accuracy. This is not the case with the prior art methods where the only advantage to a longer pulse would be that due to increased time for settling of transient voltages.

DIGITAL PROCESS

The digital process can best be understood by referring to FIG. 7. The frequency measurement is determined by combining two measurements, the virtual sub-band center frequency; obtained by come line number processor, 43, and the baseband frequency, obtained by the digital differentiator process, 44, and the digital averager process, 45. Both determinations are made from the phase measurements of the reference phase sampler, 40, and the delay phase sampler, 41, the inputs to the digital process.

Virtual Sub-band Center Frequency

These direct and reference phase measurements differ by $m \cdot \Delta\psi$, the comb harmonic number, m, times the phase shift caused by delay $\Delta\psi$, 20.

Phase difference = delay phase − reference phase

Phase difference = $2\pi \cdot Fb \cdot t + m \cdot \Delta\psi - 2\pi \cdot Fb \cdot t$ Phase difference = $m \cdot \Delta\psi$ m = Phase difference $\div \Delta\psi$ m is obtained by subtracting the reference and delay phase measurements and dividing by $\Theta$. Since only a few values of m are possible, rather than a numerical division the value of m can be found from a look-up table. The center of the virtual sub-band, Fv is at $m \cdot Ff$ so that frequency can be found by look-up table as well:

virtual sub-band center frequency=$Fv=m \cdot Fc=Fc \cdot \text{difference} \div \Delta\psi$ Baseband Frequency The baseband frequency is determined by evaluating the total phase change over the measurement interval. If the evaluation were done by finding the difference between the phase at the beginning of the sample interval, the answer would be limited to frequencies which change less that 180° over the measurement interval.

Figure 8:
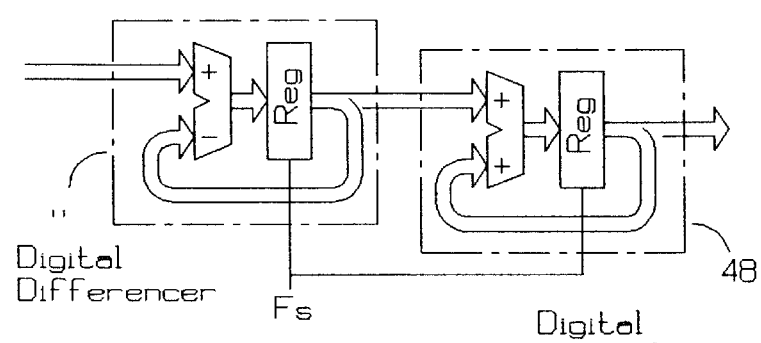
FIG. 8 Digital Processor, Phase Differencing

An important advance provided by this invention is that the phase is measured at the beginning and end of each sample clock period. In this way the measurement limit is extended to frequencies which change less than 180° over the sample interval, to ½ Fs, the Nyquist limit. Two methods are provided for processing these phase measurements. In the first method the frequency is approximated for each sample, then the individual frequency approximations are averaged over the measurement interval again according to Equation 8. The implementation is indicated in FIG. 8. The averaging extends the accuracy of the approximation in direct proportion to the number of samples in the measurement interval. The differencing is carried out by the digital differentiator 44, the averaging is carried out by the digital averager, 45.

First Method Differencing and Averaging          Eq. 8

$$Fbi = \frac{\Phi_{(i+1)} - \Phi_i}{2\pi} \cdot Fs \quad \text{frequency at sample } i$$

$$Fbs = \frac{1}{s} \sum_{i=1}^{i=s} Fbi \quad \text{average frequency over } s \text{ samples}$$

$$Fb = \frac{Fbs}{2\pi \cdot Tm}$$

where:

$Fs$ = Sampling Frequency, $Tm$ = Measurement Interval $s = F_s \cdot Tm$, number of samples in interval $Tm$ In the second method the frequency for each sample is approximated by differentiang the phase. A number of differentiation algorithms are available. Most of these involve an approximation spanning several samples. An approximation to a linear function is made, least squares or a polynomial output is the derivative of the linear function. The process is complete in a single step such as that given in Equation 3b.

The frequency approximations are again averaged over the measurement interval. Integration of the frequency approximations and division by the number of samples is particularly well suited. A number of integration algorithms can be applied include simple summation, Simpson's rule, Runga-Kutta and others. The processes are indicated in Equation 9.

Second Method Differentiation and Averaging by Integration    Eq. 9

$$Fbi = \frac{1}{2\pi} \cdot \frac{d\Phi(i)}{dt}$$

$$Fbs = \frac{1}{s} \cdot \int_{i=0}^{i=s} Fbi \, di$$

$$s = Fs \cdot Tm$$

The essential element common to both methods is that frequency is first calculated over each individual sample and that those results are averaged over the measurement interval. This extends measurement capability to the theoretical limit ½Fs and extends resolution and accuracy in proportion to the measurement interval. The derivative/integral algorithms are an improvement over differencing/summation are of advantage in overcoming noise and other forms of interference and should be considered withinn the scope of this invention. The differentiation is carried out by the digital differentiator 44, the integration based averaging is caried out by the digital averager, 45.

Final Frequency Output

The composite frequency is the sum of the vitual sub-band center frequency, Fv, the frequency variation within the virtual sub-band $_{Fb}$, the baseband frequency. These frequencies as determined are presented at different number bases. Neither is a binary representation of Hertz or MHZ. The task of scaling these components and summing them together could be done by any appropriate digital process. The use of a numerical processor would be time consuming. There are relatively few possible values; in preferred implementation a 4 GHz band was to be resolved to .625 MHZ resolution, 6400 values. So that 13 bits would be sufficient. The total could be formed by look-up tables in PROM.

I claim the following:

1. A method for measuring the frequency of an input signal occurring in an input band comprised of;

a folding down conversion step, wherein the entire input band is folded into a common baseband by mixing the said input band with the harmonics of an LO, and wherein two folding down conversions are performed, a reference down conversion employing the LO harmonics directly and a delayed down conversion employing the LO harmonics after they are delayed in time and wherein each down conversion is a quadrature down conversion, producing two conversion products in quadrature with each another and followed by a phase encoding means configured to provide a digital representation of the phase angle represented by the said quadrature conversion products, and a folding harmonic determination step, wherein the frequency of the LO harmonic, effective in folding the signal into the base band is determined by dividing the difference between the phases encoded from the reference and delayed down conversions and dividing that difference by the product of the product of the said delay and the fundamental frequency of the said folding LO and a baseband frequency measuring step, wherein the frequency of the signal occurring in one of the baseband channels is determined by constructing the rate of change of the measured phase and followed by a numerical combining step, in which the frequency of the LO harmonic effective in folding the signal into the baseband is combined with the measured baseband frequency to form the input signal frequency.

2. A frequency measuring method according to claim 1 wherein the folding LO harmonic determination step is comprised of the steps of performing two folding down conversions, a reference down conversion employing the LO harmonics directly and a delayed down converter employing the LO harmonics delayed in time thereby causing a relative phase shift between the said reference and delayed LO harmonics which varies in proportion to the product of the harmonic frequency and the said delay, so that the phase of the baseband signals resulting from the reference and delayed down conversions differ in phase in proportion to the product of the harmonic frequency effective in folding the signal into the baseband, phase sampling step, wherein the phase of the baseband signals resulting from the said reference and delayed folding down conversion signals are measured a phase differencing step in which the phase difference between the two said baseband signals is determined and a division step in which the said phase difference is divided by the said delay to yield the effective LO frequency.

3. A frequency measuring method according to claim 1 wherein the method of determining the frequency of the down converted baseband signal is comprised of the steps of:

measuring the phase of one of the baseband signals over a plurality of sample intervals forming a set of phase measures and subtracting the successive phase measurements of the set of phase in the said set forming a set of successive phase increments and summing the members of the set of phase increments thereby forming the total phase increment over the set of phase increments and forming the total of the set of sample intervals over which the set of phase measures were accumulated and dividing the total phase increment by the total sample interval time so as to determine the average phase change over the measurement interval and thereby determining the frequency of the baseband signal.

4. A frequency measuring method according to claim 1 wherein the method of determining the frequency of the down converted baseband signal is comprised of the steps of:

measuring the phase of one of the baseband signals at sample intervals and a means of determining time integral of the phase of the baseband signal followed by division of the said integral by the time over which the samples were accumulated to determine the average phase change per sample over the measurement interval so as to determine the frequency of the baseband signal.

5. A frequency measuring method according to claim 1 in which the phase sampler method is comprised the steps of:

a phase encoding step in which in-phase and quadrature components of each of the baseband signals are combined in a set of weighted summing networks and wherein weighting is appropriate to combine the in-phase and quadrature baseband signals into a set phase shifted signals substantially evenly spaced by a phase resolution increment, from the first of the baseband signals, and an examination step in which the polarity each of the set of phase shifted signals is ascertained by a set of polarity detectors and a conversion step in which the polarity states as ascertained by said zero crossing detectors are converted into a digital code.

6. A frequency measuring method according to claim 5 wherein the phase difference between the least shifted and most shifted resolved signal is less than 360° by amount substantially equal to said phase resolution increment.

7. A frequency measuring method according to claim 6 wherein the set of resolved signals, including the selected baseband signal, consists of $2^n$ members where n is an integer.

8. A means for measuring frequency of a signal occurring in an input range comprising, a frequency converter means by which the said input range of frequencies to be measured is divided into vitual sub-bands and each such sub-bands folded into two channels, a reference channel and a delayed channel by a frequency mixing means driven by the harmonics of an LO, wherein each said harmonic is a multiple of the LO frequency and so that any sigal within the said frequency range to be measured is folded into (the said) a baseband, said reference channel being generated by a quadrature mixer driven by the harmonics of the LO and the said delayed channel being generated by a quadrature mixer driven by the harmonics of the LO after a delay so that any signal within the said frequency range to be measured is folded into both the reference and delayed baseband channels, a means for determining and encoding the phase of the reference baseband channels into a digital code, a means for determination of the frequency of the LO harmonic active in folding a signal into the basebands comprised of a differencing means configured to determine the phase difference between said reference and delayed channels and a division means configured to divide said phase difference by the product of the fundamental LO frequency and the time delay and thereby determine the said harmonic number and means for determining the frequency of the down converted signal within said baseband comprised of a sampling means configured to sample and store a predetermined number of samples of the phase of one of the baseband channels during a sampling interval, a differencing means for determining the phase increment between each pair of sequential samples and a summation means configured to determine the sum of said phase increments, and a division means for dividing said summation by said sampling interval and provided thereby the frequency of the down converted baseband signal, a combining means by which a number representing the LO multiple active in folding the signal into the baseband and a number representing the frequency of the down converted signal within the baseband are combined into a number representing the frequency of the signal.

9. A frequency measuring means according to claim 8 wherein the means for determination of the LO harmonic active in the folding down conversion is comprised of;

a reference folding down converter means employing the LO harmonics directly and a delay folding down converter means employing the LO harmonics delayed in time so as to cause a phase shift of the delayed LO relative to of the reference LO in proportion to LO harmonic active in the folding down convesion and a concomitant phase shift of the delayed baseband signal relative to the reference baseband signal resuting from the reference and delayed folding down converters sampling means for said delayed and said reference baseband signals, configured to sample the phase of said reference and delayed baseband signals and means for determining the difference between the phases of said reference and delayed baseband signals and for determining the quotient of the said difference and the said time delay.

10. A frequency measuring means according to claim 8 wherein the a means for determining the frequency of the down converted baseband signal is comprised of a phase sampling means for measuring the phase of the baseband signal at successive sample times and means determining the phase increment between two such samples and for accumulating one or more such phase increments and means for accumulating the corresponding sample interval and means for dividing by accumulated phase by the accumulated interval.

11. A frequency measuring method according to claim 8 wherein the method of determining the frequency of the down converted baseband signal by obtaining the derivative of phase with respect to time comprised of the steps of extracting samples from the phase sampler of one of the baseband signals together with the time at which samples are taken, means for obtaining the phase difference between successive samples, means for accumulating the said phase differences and sample intervals over a plurality of successive samples, means for dividing said accumulated phase differences by the accumulated sample interval and obtaining there by the frequency of said baseband signal.

12. A frequency measuring means according to claim 8 in which the phase sampling means is comprised of:

a phase resolution means adapted to combine the in-phase and quadrature components of the baseband signals by resistors weighted appropriately to form a set phase shifted signals from the said in-phase and quadrature components, to yield a set of signals which are shifted in phase from the said baseband signal by substantially even multiples of a phase resolution amount, and followed by an examination means for determining the polarity each of the set of shifted signals by a set of polarity detecting means and followed by an encoding means for combining the states of said set of polarity detector means into a digital code representing the phase of the said baseband signal.

13. A frequency measuring means according to claim 8 wherein the phase shifted signals are shifted in phase from the baseband signal by multiples of a phase resolution element and wherein the phase difference between the baseband signal and the most shifted phase is less than 360° by the phase resolution amount.

14. A frequency measuring means according to claim 13 wherein the set of phase shifted signals, including the said one baseband signal is comprised of $2^n$ members where n is an integer.

* * * * *